United States Patent [19]

Johnson et al.

[11] Patent Number: 5,729,185
[45] Date of Patent: Mar. 17, 1998

[54] ACOUSTIC WAVE FILTER PACKAGE LID ATTACHMENT APPARATUS AND METHOD UTILIZING A NOVOLAC EPOXY BASED SEAL

[75] Inventors: Gary Carl Johnson, Tempe; David Patrick Stumbo, Scottsdale; Steven Richard Young, Gilbert; Michael Anderson, Phoenix, all of Ariz.

[73] Assignee: Motorola Inc., Schaumburg, Ill.

[21] Appl. No.: 639,673

[22] Filed: Apr. 29, 1996

[51] Int. Cl.⁶ ............................. H03H 9/64; H01L 41/00
[52] U.S. Cl. .................... 333/193; 310/313 R; 29/25.35
[58] Field of Search ............................. 333/193–196; 310/313 R, 313 B, 313 C, 313 D, 340, 341, 344, 348; 29/25.35

[56] References Cited

U.S. PATENT DOCUMENTS

| | | | |
|---|---|---|---|
| 4,047,129 | 9/1977 | Ishiyama | 333/193 |
| 4,213,104 | 7/1980 | Cullen et al. | 333/150 |
| 4,282,498 | 8/1981 | Iizawa | 333/186 |
| 4,291,285 | 9/1981 | Kadota | 333/150 |
| 4,295,102 | 10/1981 | Schmidt et al. | 331/65 |
| 4,296,347 | 10/1981 | Weirauch | 310/313 B |
| 4,306,456 | 12/1981 | Maerfeld | 73/517 R |
| 4,365,219 | 12/1982 | Nathan | 333/193 |
| 4,450,374 | 5/1984 | Cho et al. | 310/313 B |
| 4,480,148 | 10/1984 | Archer | 174/51 |
| 4,571,794 | 2/1986 | Nakamura | 29/25.35 |
| 4,628,146 | 12/1986 | Schmotz et al. | 174/52 PE |
| 4,699,682 | 10/1987 | Takishima | 156/292 |
| 4,737,742 | 4/1988 | Takoshima et al. | 333/150 |
| 5,043,221 | 8/1991 | Koleske | 428/413 |
| 5,059,848 | 10/1991 | Mariani | 310/313 R |
| 5,162,822 | 11/1992 | Wakamori | 333/193 |
| 5,237,235 | 8/1993 | Cho et al. | 29/25.35 X |
| 5,337,026 | 8/1994 | Borchelt et al. | 333/150 |
| 5,345,201 | 9/1994 | Greer et al. | 333/193 |
| 5,361,967 | 11/1994 | Anderson et al. | 228/124.6 |
| 5,410,789 | 5/1995 | Noto et al. | 29/25.35 |
| 5,414,917 | 5/1995 | Tanaka | 29/25.35 |

FOREIGN PATENT DOCUMENTS

| | | | |
|---|---|---|---|
| 1389610 | 8/1973 | European Pat. Off. | |
| 0077715 | 5/1984 | Japan | 310/344 |
| 0049310 | 3/1991 | Japan | 333/195 |
| 6132759 | 10/1992 | Japan | |
| 405090882 A | 4/1993 | Japan | 333/193 |
| 9639632 | 12/1996 | WIPO | |

Primary Examiner—Robert Pascal
Assistant Examiner—Barbara Summons
Attorney, Agent, or Firm—Brian M. Mancini

[57] ABSTRACT

A method for packaging an acoustic wave filter (102). The method includes a step of providing a first wafer (100). The first wafer (100) supports acoustic wave transduction and propagation. The method also includes steps of processing the wafer (100) to provide transducer patterns (18, 18') thereon and disposing a seal ring (25) on the wafer (100). The seal ring (25) completely encloses active areas allowing portions of each bond pad to extend outside of the seal ring. The method further includes steps of disposing a second wafer (40) atop the seal ring (25) and the first wafer (100), sealing the second wafer (40) to the first wafer (100), dicing the second wafer (40) with a saw that provides a first kerf width, whereby portions of the second wafer (40) overlying bonding pads (20) of the transducer patterns (18, 18') are removed and dicing the first wafer (100) with a saw that provides a second kerf width narrower than the first kerf width to provide a packaged SAW die.

19 Claims, 2 Drawing Sheets

ACOUSTIC WAVE FILTER PACKAGE LID ATTACHMENT APPARATUS AND METHOD UTILIZING A NOVOLAC EPOXY BASED SEAL

FIELD OF THE INVENTION

This invention relates in general to the field of frequency selection component packages, in particular to surface acoustic wave frequency selection component packages and more particularly to a simplified technique for lid attachment for acoustic wave frequency selection component packages.

BACKGROUND OF THE INVENTION

A broad variety of new demands is being placed on the electromagnetic spectrum, leading to difficulty in allocating radio wave frequency bands as new kinds of equipment based on radio wave communication are developed. Such demands provide pressure to employ progressively higher radio frequencies (e.g., >500 megahertz) and need to utilize spectral space more efficiently. These trends create requirements for frequency selection components capable of high frequency operation and increasingly narrow passbands. Additionally needed are devices having low insertion loss coupled with improved out-of-band signal rejection, in a small form factor and with low power consumption.

Acoustic wave devices are becoming particularly important in the construction of electronic signal processing equipment, such as radios, paging devices, and other high frequency electronic apparatus, because they can be readily constructed on planar surfaces using integrated circuit fabrication techniques, are robust and compact, require no initial or periodic adjustment and consume no static power. Thus, SAW resonators and other types of acoustic wave frequency selection components are extremely desirable for high frequency filtering applications.

The surface vibrations that cause these devices to have extreme utility in modern communications apparatus lead to packaging constraints that differ from those of most microelectronic components. These vibrations are damped (and the frequency selection characteristics impaired or destroyed) by the presence of surface contamination and especially by condensation of liquids on the device surface. Typically this is obviated by employing hermetic packages that do not physically touch the active device surface. As a result, it has been difficult or impossible to provide packages for these devices using technologies (e.g., transfer molding) that have been developed for other types of microelectronic parts.

A second problem that hermetically sealed packages engender is that the finished, packaged device is typically much larger than the SAW device die. A reduction in size and/or weight of the completed and packaged frequency selection component provides significant advantages in the applications for which these devices are designed, e.g., portable telephones, paging apparatus and the like.

A third problem that arises is that hermetic packages typically include a higher labor and material content than, e.g., transfer molded packages. This, in turn, is reflected in the total labor content of the completed communications apparatus in which these devices are used.

What are needed are apparatus and techniques for acoustic wave device packaging that provide a small, light-weight device package having an open area above the die surface, that do not require substantial internal volume and that are easily implemented in a fashion consistent with current acoustic device design, fabrication and use practices.

DETAILED DESCRIPTION OF THE DRAWINGS

Figure 1:
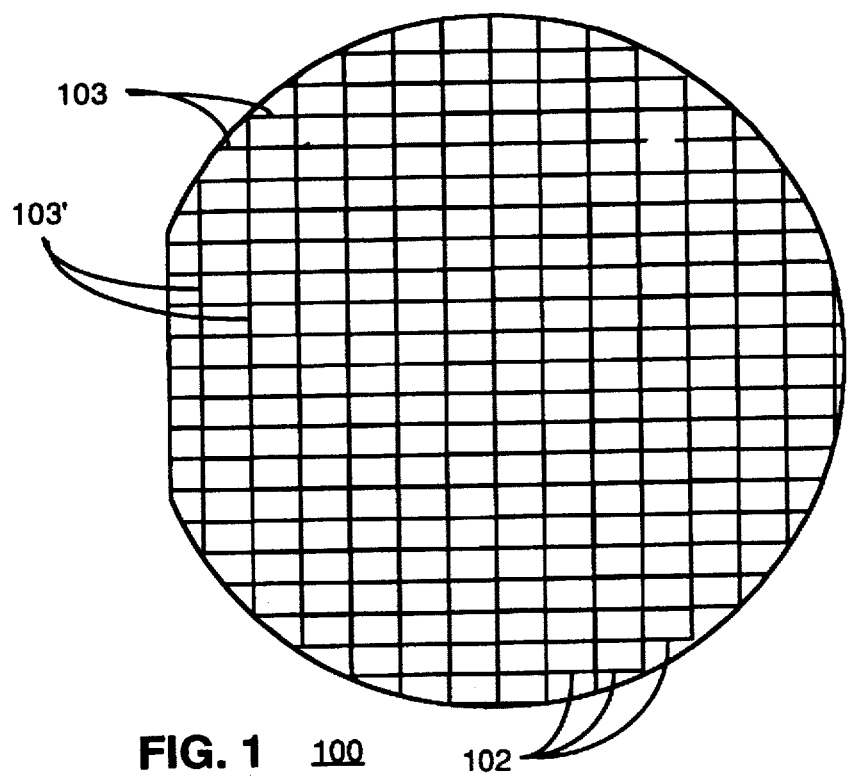
FIG. 1 is a simplified plan view of a wafer of acoustic wave filter dice.

FIG. 1 is a simplified plan view of wafer 100 including acoustic wave filter dice 102. Typically, wafer 100 is diced by a high speed saw along scribe lines 103, 103' to separate individual die 102 for packaging. Substrate or wafer 100 typically comprises crystalline quartz, lithium niobate ($LiNbO_3$), lithium tantalate ($LiTaO_3$), lithium tetraborate ($Li_2B_4O_7$) or zinc oxide films deposited on suitable substrata and includes a polished surface upon which device patterns are formed by photolithographic techniques similar to those employed in the manufacture of integrated circuits or other microelectronic components.

Figure 2:
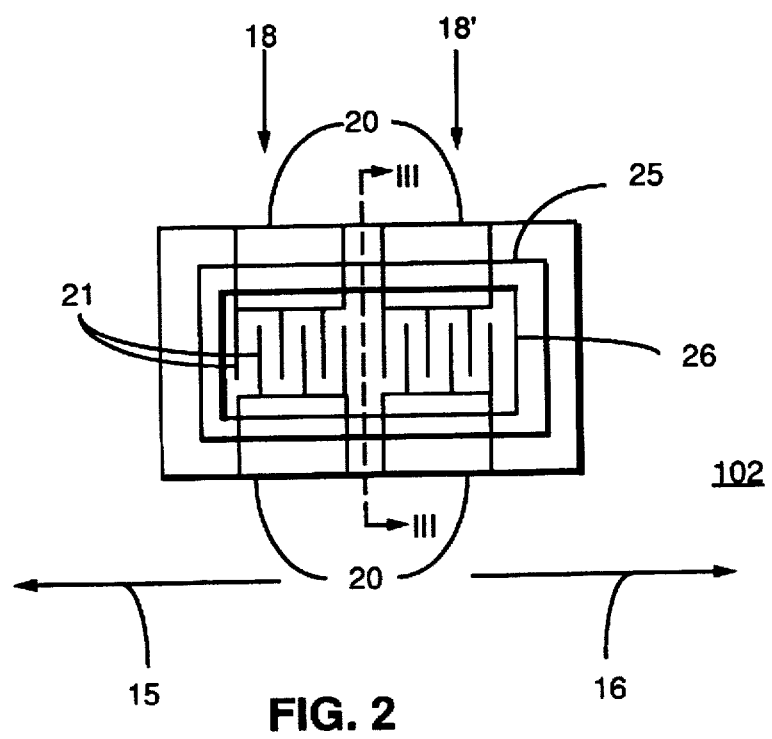
FIG. 2 is a simplified plan view of an acoustic wave filter die in accordance with the present invention.

FIG. 2 is a simplified plan view of acoustic wave filter die 102 in accordance with the present invention. Die 102 is illustrated as including two surface acoustic wave transducers 18, 18', but it will be appreciated that more or fewer transducers 18, 18' may be included for specific performance reasons. Each transducer 18, 18' includes bond pads 20 and interdigitated electrodes 21. The region including electrodes 21 and areas between electrodes 21 is referred to herein as the "active region" and is enclosed within inner border 26 of seal ring 25. When electrical stimulation at an appropriate frequency is supplied to bond pads 20 of transducer 18 or 18', acoustic waves are generated on the surface of die 102 and travel along directions 15 and/or 16, usually corresponding to a principal axis of the material comprising die 102 (and wafer 100). When acoustic waves of an appropriate frequency impinge upon electrodes 21 of transducer 18 or 18', electrical signals are manifested at the appropriate bond pads 20. It will be appreciated that other types of SAW filters may include other kinds of features and that device 102 is intended for purposes of illustration and not of limitation.

Applicants have discovered that seal ring 25 may be conveniently realized by dispensing and photolithographically shaping photosensitive epoxy on the surface of wafer 100 prior to dicing. Photosensitive epoxy may be realized as SU-8-75 novolac epoxy available from Shell Chemical Co. of Houston Tex. combined with methyl ethyl ketone (MEK) (or other suitable casting solvent) in proportions such as 75:25 by weight. More or less casting solvent may be employed as desired to achieve a particular film thickness. An onium salt is then added in an amount ranging from 1 to 10 percent by weight to achieve a desired range of sensitivity to ultraviolet light exposure. For example, the mixture previously given might then be mixed to include 90:10 by weight with Cyracure UVI 6074 available from Union Carbide of Danbury Conn. This mixture may be spun on at a speed of 600 rpm to realize a film of thickness of about 20 micrometers. Various thicknesses may be useful; generally thicknesses in a range of one to forty micrometers are of utility with respect to the instant invention. Other onium salts are usefully employed for providing the desired photosensitivity. Examples include Cyracure-6076 and General Electric UVE-1014 or -1016.

After spinning, the layer is cured via a bake at 95° C. for five minutes. Following exposure of regions such as 25 to radiation having a wavelength of 365 nm in a dose of 750 to 1250 millijoules per square cm., epoxy may be removed from other areas of die 102 by rinsing in propylene glycol monoethyl acetate for a period of five minutes. A post-exposure bake (laying flat) at 100°–120° C. for ten minutes is then carried out.

Seal ring 25 has several requirements; (i) it must completely surround and enclose the active area of die 102, (ii) it must not extend into the active area of die 102 to any significant extent, (iii) it must not provide contamination of the active area of die 102, for example, by outgassing, (iv) it must allow pads 20 to extend from within the active area of die 102 to an area outside seal ring 25 and (v) it, together with an adhesive layer (not illustrated) disposed between seal ring 25 and lid 40 (FIG. 3), must secure lid 40 to die 102 and prevent intrusion of foreign materials during overmolding and at any other time. The latter requirement includes maintaining integrity of seal ring 25 under conditions of 160°–190° C. at a pressure usually in a range of 500–1800 psi (with 1000 psi being typical) for a period of 30 seconds to 3 minutes, with 2 minutes being typical. A sixth requirement of seal ring 25 together with lid 40 is that (vi) they must separate the lower surface of lid 40 from the active area of the die to a suitable extent (at least a few micrometers).

An advantageous feature of this process is that it allows lid 40 to be attached to die 102 while still in wafer form. This is effected by, for example, placing a second wafer (not illustrated), preferably but not necessarily of the same material as substrate 102 and desirably having similar crystallographic orientation, atop wafer 100 after deposition and patterning of seal ring 25 and application of a sealing material (not illustrated) to a second wafer that will become lid 40, applying pressure and curing the layer of sealing material disposed on one side of the second wafer to effect a seal. The sealing material may comprise a suitable thermoplastic thinned with casting solvent and spun onto the second wafer, a UV curable epoxy such as described in connection with seal ring 25 or other microelectronic grade sealing material or adhesive consistent with the properties listed supra for seal ring 25. It will be appreciated that lid 40/second wafer may comprise metals (e.g., Cu), ceramic or glass materials having suitably chosen thermal expansion characteristics.

Advantages of using the same material for both the first 100 and second wafers include the fact that most SAW substrates comprise materials transparent to visible light, allowing ready alignment of both first 100 and second wafers to each other and together to the saw for dicing. Transparency of lid 40 to ultraviolet radiation also permits use of UV curable seal epoxy disposed on the bottom of lid 40 as the agent for sealing lid 40 to seal ring 25. Another advantage is that some SAW substrata have anisotropic thermal expansion properties. Use of a lid structure 40 that matches the thermal properties of die 102 reduces thermally induced stresses on seal ring 25. In one embodiment of the instant invention, the second wafer includes recesses (dashed line 41, FIG. 3) disposed to coincide with the active area of SAW die 102. This prevents the lid from contacting the active area. In another embodiment, seal ring 25 is made to be tall enough to provide adequate clearance over the active area. Bond pads 20 extend beyond seal ring 25, allowing electrical interconnection of transducers 18, 18' to external electrical apparatus.

The sandwich of wafer 100 and the second wafer may then be diced, first slicing the second wafer with a blade having a wide kerf (e.g., ca. 1 mm or 40 mils) along scribe lines 103, 103' and then slicing wafer 100 with a blade having a narrower kerf (e.g., 125–150 micrometers or 5–6 mils). The result of the dicing operation is shown in cross-sectional side view in FIG. 3.

Figure 3:
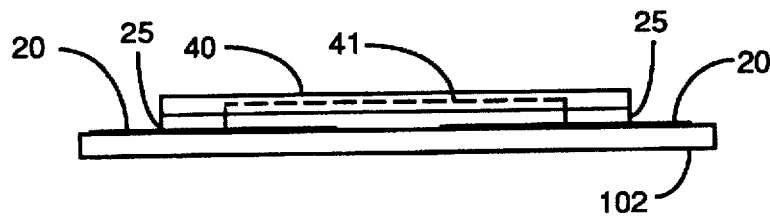
FIG. 3 is a side view, in section, taken along section lines III—III of FIG. 2, showing the acoustic wave filter die with an attached lid in accordance with the present invention.

FIG. 3 is a side view, in section, taken along section lines III—III of FIG. 2, showing acoustic wave filter die 102 with attached lid 40 in accordance with the present invention. Lid 40 is shown as being spaced apart from the surface of die 102 by seal ring 25 and/or via cavity 41 within the lower surface of lid 40. Bond pads 20 extend beyond the edges of lid 40 to allow interconnection of transducers 18, 18' to external apparatus. After bond wires (not illustrated) are attached, the assembled device may be encapsulated by conventional transfer molding to provide a packaged SAW device that is compact, lightweight and robust.

Figure 4:
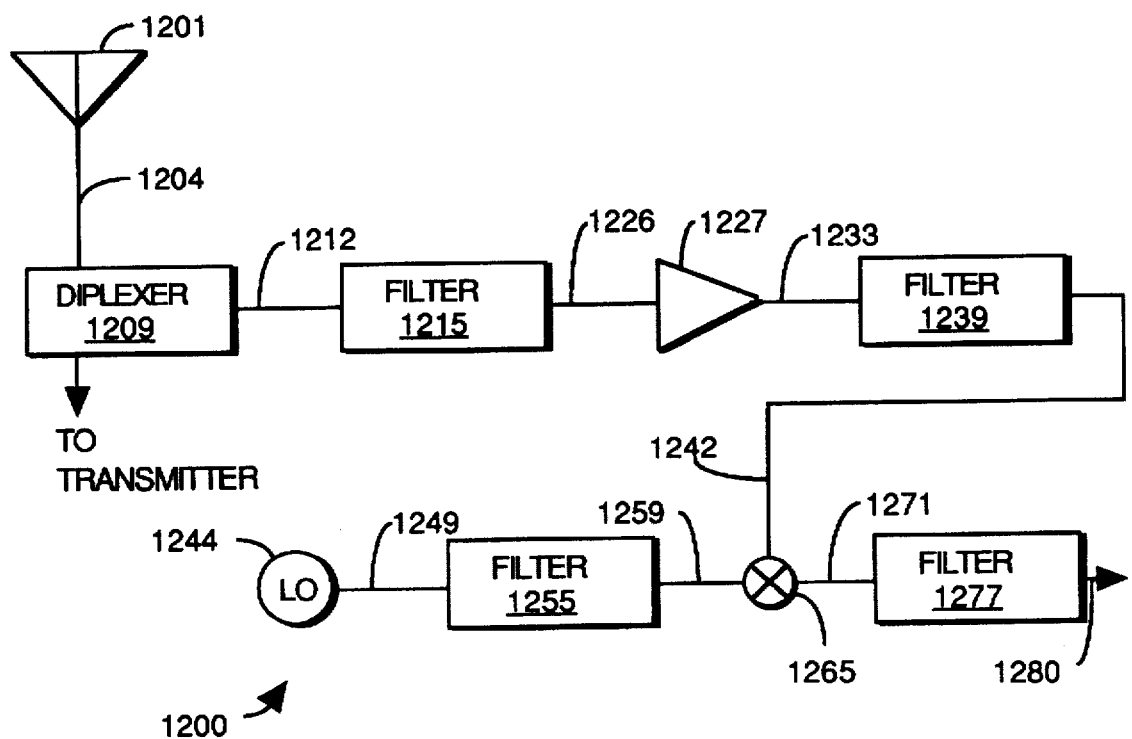
FIG. 4 is a block diagram of a portion of a radio frequency apparatus including acoustic wave filters in accordance with the present invention.

FIG. 4 is a block diagram of portion 1200 of a radio or other communications apparatus including one or more acoustic wave filters in accordance with the present invention. Apparatus 1200 includes antenna 1201 and antenna lead 1204, by way of example, used to receive and/or transmit signals.

Alternatively, antenna 1201 and antenna lead 1204 could be replaced by a fiber-optic link or a cable or other signal transmissive media. Diplexer 1209 is coupled to antenna 1201 and antenna lead 1204 and to a transmitter portion (not shown). Diplexer 1209 couples received signals to filter 1215 via lead 1212. Filter 1215 is coupled to amplifier 1227 via lead 1226.

The output of amplifier 1227 is coupled to filter 1239 via lead 1233. Filter 1239 couples its output signal to mixer 1265 where the signal coupled by lead 1242 is combined with another signal from local oscillator 1244 coupled via filter 1255 and leads 1249 and 1259. The signal which is output from mixer 1265 via lead 1271 is then passed through filter 1277 to provide an intermediate frequency or IF output signal via lead 1280.

Diplexer 1209, filter 1215, filter 1239, filter 1255 and/or filter 1277 may comprise acoustic wave filters according to the present invention.

Thus, a SAW device package has been described which overcomes specific problems and accomplishes certain advantages relative to prior art methods and mechanisms. The improvements over known technology are significant. The expense, complexities, and higher labor content of prior art approaches are avoided. Similarly, a compact yet robust device package is provided that allows relaxed package specifications and reduced size and weight of the completed and packaged filter.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

We claim:

1. A method for packaging an acoustic wave filter, said method comprising steps of:

providing a first wafer, said first wafer capable of supporting acoustic wave transduction and propagation;

processing said first wafer to provide transducer patterns thereon; and disposing a seal ring comprising a novolac epoxy, casting solvent and onium salts in suitable proportions onto a surface of said first wafer about an active area of said transducer patterns, said seal ring completely enclosing said active area such that portions of each bond pad of said transducer patterns extend outside of said seal ring.

2. A method as claimed in claim 1, further comprising steps of:

disposing a second wafer atop said seal ring and said first wafer;

sealing said second wafer to said first wafer;

dicing said second wafer with a saw that provides a first kerf width, whereby portions of said second wafer overlying bonding pads of said transducer patterns are removed; and dicing said first wafer with a saw that provides a second kerf width narrower than said first kerf width to provide a packaged SAW die.

3. A method as claimed in claim 2, further comprising a step of molding said packaged SAW die to provide a completed SAW filter.

4. A method as claimed in claim 2, wherein:

said step of providing a first wafer includes a step of providing a first wafer chosen from a group consisting of quartz, lithium niobate, lithium tantalate and lithium tetraborate;

said step of disposing a second wafer includes a step of disposing a second wafer chosen from a group consisting of quartz, lithium niobate, lithium tantalate and lithium tetraborate; and said first and second wafers are chosen to comprise materials having similar compositions.

5. An acoustic wave filter packaged by the method of claim 2.

6. A method as claimed in claim 2, wherein said step of disposing a second wafer includes a step of disposing a second wafer chosen from a group consisting of quartz, zinc oxide, lithium niobate, lithium tantalate and lithium tetraborate.

7. A method as claimed in claim 1, wherein said disposing step includes substeps of:

spinning the novolac epoxy including SU-8-75 novolac epoxy, casting solvent and onium salts in suitable proportions onto the surface of said first wafer;

baking said novolac epoxy at a temperature of about 95° C. for a time in a range of from one to twenty minutes;

exposing portions of said novolac epoxy to a dose of 750 to 1250 millijoules of light having a wavelength of about 365 nanometers; and rinsing said novolac epoxy with propylene glycol monoethyl acetate to remove unexposed novolac epoxy from said first wafer to provide a seal ring of novolac epoxy completely surrounding an active area of a SAW die.

8. A method as claimed in claim 1, wherein said step of providing a first wafer includes a step of providing a first wafer chosen from a group consisting of quartz, zinc oxide, lithium niobate, lithium tantalate and lithium tetraborate.

9. An acoustic wave filter comprising:

a first wafer, said first wafer capable of supporting acoustic wave transduction and propagation;

transducer patterns disposed on said first wafer; and a seal ring comprising a novolac epoxy, casting solvent and onium salts in suitable proportions disposed on a surface of said first wafer about an active area of said transducer patterns, said seal ring completely enclosing said active area such that portions of each bond pad of said transducer patterns extend outside of said seal ring.

10. An acoustic wave filter as claimed in claim 9, further comprising:

a second wafer disposed atop said seal ring and said first wafer, said second wafer sealed to said first wafer;

said second wafer diced with a saw that provides a first kerf width, whereby portions of said second wafer overlying bonding pads of said transducer patterns are removed; and said first wafer diced with a saw that provides a second kerf width narrower than said first kerf width to provide a packaged SAW die.

11. An acoustic wave filter as claimed in claim 10, wherein said second wafer includes a second wafer chosen from a group consisting of quartz, zinc oxide, lithium niobate, lithium tantalate and lithium tetraborate.

12. An acoustic wave filter as claimed in claim 10, wherein:

said first wafer includes a first wafer chosen from a group consisting of quartz, lithium niobate, lithium tantalate and lithium tetraborate;

said second wafer includes a second wafer chosen from a group consisting of quartz, zinc oxide, lithium niobate, lithium tantalate and lithium tetraborate; and said first and second wafers are chosen to comprise materials having similar compositions.

13. An acoustic wave filter as claimed in claim 9, wherein said first wafer includes a first wafer chosen from a group consisting of quartz, zinc oxide, lithium niobate, lithium tantalate and lithium tetraborate.

14. An acoustic wave filter as claimed in claim 9, wherein said seal ring is disposed to a thickness in a range of from one to forty micrometers.

15. In a radio, an acoustic wave filter comprising:

a first wafer, said first wafer capable of supporting acoustic wave transduction and propagation;

transducer patterns disposed on said first wafer; and a seal ring comprising a novolac epoxy, casting solvent and onium salts in suitable proportions disposed on a surface of said first wafer about an active area of said transducer patterns, said seal ring completely enclosing said active area such that portions of each bond pad of said transducer patterns extend outside of said seal ring.

16. In a radio, an acoustic wave filter as claimed in claim 15, further comprising a second wafer disposed atop said seal ring and said first wafer, said second wafer sealed to said first wafer, said second wafer diced with a saw that provides a first kerf width, whereby portions of said second wafer overlying bonding pads of said transducer patterns are removed, and said first wafer diced with a saw that provides a second kerf width narrower than said first kerf width to provide a packaged SAW die.

17. In a radio, an acoustic wave filter as claimed in claim 15, further comprising a molded plastic package disposed about said SAW die, and wherein said novolac epoxy includes SU-8-75 novolac epoxy.

18. In a radio, an acoustic wave filter as claimed in claim 16, wherein:
   said first wafer includes a first wafer chosen from a group consisting of quartz, zinc oxide, lithium niobate, lithium tantalate and lithium tetraborate;
   said second wafer includes a second wafer chosen from a group consisting of quartz, zinc oxide, lithium niobate, lithium tantalate and lithium tetraborate; and said first and second wafers are chosen to comprise materials having similar compositions.

19. In a radio, an acoustic wave filter as claimed in claim 15, wherein said first wafer includes a first wafer chosen from a group consisting of quartz, zinc oxide, lithium niobate, lithium tantalate and lithium tetraborate.

* * * * *